United States Patent [19]

Domokos

[11] Patent Number: 4,858,764
[45] Date of Patent: Aug. 22, 1989

[54] ADJUSTABLE CARRIER DEVICE FOR CERAMIC SUBSTRATES AND THE LIKE

[75] Inventor: Julius Domokos, Fountain Valley, Calif.

[73] Assignee: Hughes Aircraft Company, Los Angeles, Calif.

[21] Appl. No.: 208,443

[22] Filed: Jun. 20, 1988

[51] Int. Cl.⁴ .................. B65D 85/30; H05K 7/16
[52] U.S. Cl. .................. 206/449; 206/334; 206/454; 211/41; 220/22.3; 248/316.2; 312/14; 361/415
[58] Field of Search .............. 206/445, 454, 449, 309, 206/334, 328, 4, 7, 45, 46, 47; 211/40, 41, 42, 43; 312/10–17, 305; 220/22.3, 22.4; 248/316.2, 316.3; 361/415

[56] References Cited

U.S. PATENT DOCUMENTS

| | | |
|---|---|---|
| 1,240,402 | 9/1917 | Almon ................................... 312/15 |
| 1,412,456 | 4/1922 | Cudlipp ................................. 211/40 |
| 2,600,298 | 6/1952 | Jarrett ................................... 211/41 |
| 2,916,341 | 12/1959 | Punt ..................................... 312/11 |
| 3,014,594 | 12/1961 | Kerstner ................................ 211/41 |
| 4,157,583 | 6/1979 | Basmajian ........................ 361/415 X |
| 4,162,006 | 7/1979 | Wilson ............................ 206/454 X |
| 4,261,465 | 4/1981 | Thomas ............................... 206/334 |
| 4,418,820 | 12/1983 | Nagle et al. ......................... 206/334 |
| 4,446,966 | 5/1984 | Moloney .............................. 206/334 |
| 4,506,785 | 3/1985 | Seefeldt .............................. 206/334 |
| 4,527,222 | 7/1985 | Swingley, Jr. .................. 206/334 X |
| 4,696,395 | 9/1987 | Rivold ................................. 206/334 |
| 4,715,669 | 12/1987 | Baille et al. ......................... 312/12 |

FOREIGN PATENT DOCUMENTS 2653269  6/1978  Fed. Rep. of Germany ...... 206/334

Primary Examiner—Bryon P. Gehman
Attorney, Agent, or Firm—Terje Gudmestad; Mark J. Meltzer

[57] ABSTRACT

An adjustable carrier device is disclosed for storage and handling of fragile panel-like structures such as semiconductor wafers, ceramic substrates, LCD panel displays, printed wiring boards and the like. The device is adjustable to receive structures of different sizes without the use of any tools. The device comprises a slotted side wall for receiving one side edge of the panel-like structure, and a sized adjusting member having a semi-circular cross-section which is mounted on an offset pivot for movement toward or away from the slotted side wall to adjust to the size of the product. Slots are formed in the edge of the offset pivot member to receive another edge of the stored structure. A cover is provided for protection to enclose the panel-like structures when placed in the carrier device to prevent damage. No tools are required to adjust the device to different product sizes.

17 Claims, 2 Drawing Sheets

ADJUSTABLE CARRIER DEVICE FOR CERAMIC SUBSTRATES AND THE LIKE

BACKGROUND OF THE INVENTION

The present invention pertains to the field of carriers for racking or storing panel-like structures such as ceramic substrates, printed wiring boards, semiconductor wafers, LCD panel displays and the like, and more particularly to an adjustable carrier structure which adjusts to structures of varying sizes without the use of tools.

Many businesses require the handling and storage of fragile panel-like structures or parts, with the attendant problems of product breakage, chipping, scratching and other damage during handling. Examples of such parts include ceramic substrates for circuits, semiconductor wafers, liquid crystal display panels and the like. Carrier devices are available for protection of the parts in transit or storage. In many cases, however, the products may be available in more than one size, requiring either that more than one size of carrier device be stocked in order to handle the available sizes of parts, or that the carrier structure be adjustable to accommodate different parts sizes.

Known carrier devices are either adjusted to a permanent shape or size, or require tools to change from one configuration to another as needed. Examples of adjustable carriers include the A135, PA83 and PA85 series of adjustable carriers marketed by Flouroware of Chaska, Minn. Such devices are adjusted by loosening several nuts, adjusting the positions of components and tightening the nuts again. Further, these devices require assembly of the various parts, with tools such as screwdrivers and nut drivers. The components of these devices can come apart, and can suffer damage or loss if disassembled.

The requirement of the conventional adjustable carrier devices that tools be used for assembly or size adjustment is a significant disadvantage. In a stockroom environment it is not practical to have highly mechanized packaging devices. The personnel involved in the handling and storing of the product are often not skilled in the use of the tools required for assembly and adjustment of the carriers. Further, such assembly and adjustment processes are time consuming.

It would therefore represent an advance in the art to provide a carrier device for panel-like structures or the like which is adjustable to accommodate various product sizes, without the use of tools, and which can greatly reduce the need for stocking various sizes of carriers.

SUMMARY OF THE INVENTION

In accordance with the invention, a carrier device is provided for carrying panel-like parts in predetermined part locations and which is adjustable over a continuous size range to accommodate parts of different sizes. The device comprises an elongated side plate member having a plurality of aligned slots formed therein. The width of each slot is sized to receive an edge of the part within the slot. The device in its preferred form further comprises a semi-cylindrical adjustment member having a plurality of aligned circumferential slots defined therein. The width of the circumferential slots is also sized to receive an edge of the part therein. First and second aligned pivot-pin members extend from the ends of the adjustment member, offset from its center axis.

The device further comprises a pivot yoke formed by a pair of opposed end plate members which provides a means for mounting the adjustment member for rotation about the pivot pin member so as to provide an eccentric pivot. Each circumferential slot in the adjustment member is aligned with a corresponding slot in the side plate to define a particular part storage location. As the adjustment member is pivoted on the eccentric pivot, the distance between the respective circumferential slot and the corresponding side plate slot is varied to adjust to a particular part size. Further, means may be provided for removably securing the side plate at a plurality of distances from the eccentric pivot axis to increase the adjustment range of the carrier device. Thus, the carrier device adjusts to rack parts of different sizes simply by rotation of the adjustment member, without the use of tools and without disassembly of the carrier device.

BRIEF DESCRIPTION OF THE DRAWINGS

These and other features and advantages of the present invention will become more apparent from the following detailed description of exemplary embodiments thereof, as illustrated in the accompanying drawings, in which.

DETAILED DESCRIPTION OF THE PREFERRED EMBODIMENTS

Figure 1:
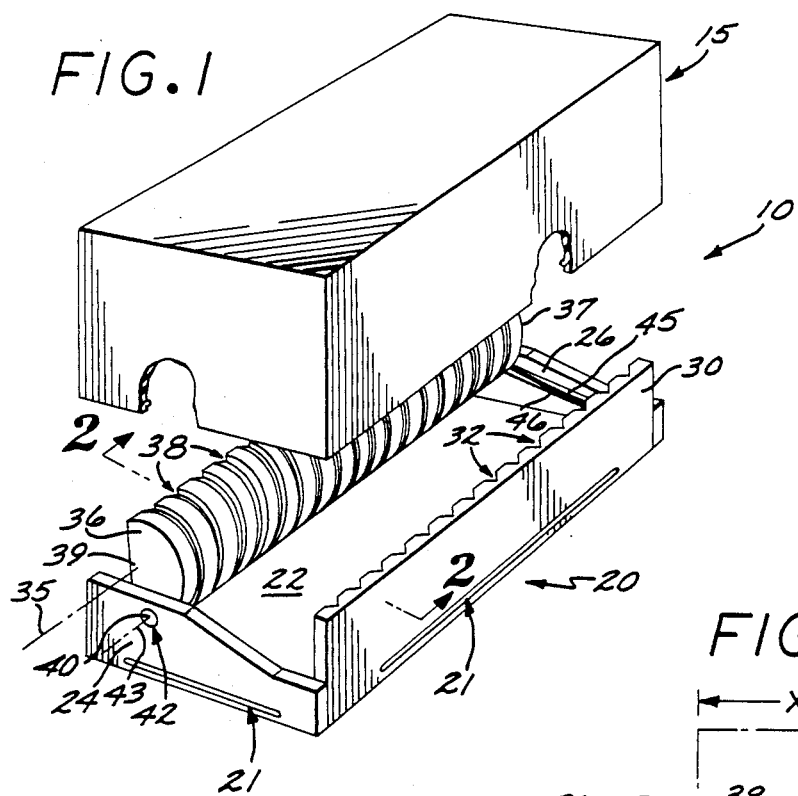
FIG. 1 is a perspective view of a first embodiment of an adjustable carrier device embodying the invention.

FIG. 1 is a perspective view of a first embodiment of an adjustable carrier device 10 embodying the invention. The device 10 generally comprises a removable cover 15 which mates with the carrier structure 20. The structure 20 comprises a flat bottom plate member 22 to which are secured upstanding end plate members 24 and 26 and longitudinal side plate member 30. The members 22, 24, 26 and 30 form a box-like structure, which may also include a second side plate member (not shown) opposing the side plate member 30 for closing the remaining open side of the box-like structure if desired.

Tabs (not shown) formed at edges of the cover 15 are received in slots 21 formed in the end and side plate members to removably secure the cover in a protecting position.

The side member 30 may be formed with a plurality of aligned slots 32 which extend substantially perpendicular to the bottom plate member 22.

The structure 20 further comprises a semicylindrical adjustment member 36 which has pivot pins 40 extending from each end 35 and 37 thereof, and which mate with openings 42 formed in the respective end plate members 24 and 26. Thus, the end plate members 24 and 26 form a yoke for pivotally mounting the adjustment member 36 on a pivot axis 43. The pins 40 are offset from the center axis 39 of the member 36 so that the adjustment member 36 pivots eccentrically.

The adjustment member 36 further comprises a plurality of slots or grooves 38 which are formed circumferentially around the surface thereof. The pivot axis 43 of the adjustable member 36 is parallel to the side plate member 30, and each of the slots 38 is aligned with a respective one of the slots 32 formed in the side member 30. The alignment of the slots 32 and 38 are maintained even as the adjustment member 36 is pivoted about the yoke axis 43 to effect an adjustment in the spacing between the periphery of the adjustment member 36 and the side plate member 30.

The slots 32 and 38 in this embodiment have a triangular-like cross-sectional configuration to provide further flexibility in the width dimension of parts which may be racked in the device 10.

The fit of the pins 40 in openings 42 is preferably relatively tight, so that the position of the adjustable member 36 is maintained after it has been rotated to a desired position. This relatively tight fit will ensure that the adjustable member 36 will not freely rotate after parts have been loaded into the device 10, and thereby permit the parts to become dislodged from their racked positions.

Figure 2:
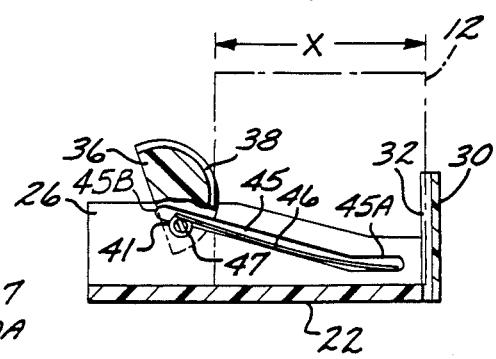
FIG. 2 is a cross-sectional view of the embodiment of FIG. 1 taken along line 2—2 of FIG. 1.

Referring now to FIG. 2, a means for providing tension or friction on the pivot pins in the end plate members is illustrated. A slanted slot 45 having dog-leg section 45A is formed in end plate member 26. End 45B of the slot tangentially intersects the periphery of the pivot pin opening formed in the end plate member 26. A rigid wire 46, such as music wire, is captured within the slot 45 and is received in a groove 47 formed in pivot pin 41. The wire 46 provides a tension or spring force against the pivot pin 41, urging it against the wall defining the pivot pin opening formed in the end plate member 26. A similar tensioning wire arrangement is provided for the end plate member 24 and the pivot pin 40.

The pivot pin tensioning means ensures that the adjustment member 36 will maintain the angular position to which it has been set, against the force of gravity or the like. The tensioning means also compensates for wear and for coefficients of temperature of the materials comprising the pivot pins and end members. The latter effect will occur in hot solution cleaning applications. Other tensioning means can be utilized, such as fabricating the pivot pins as split pins of a nominal expanded pin diameter which are press fit into pivot pin openings which have a smaller diameter.

To use the structure 10, say for thin rectangular panel-like parts such as part 12 (FIG. 2), the parts are placed in the structure 20 with one edge inserted in a slot 32 of the side plate member 30. The adjustment member 36 is then rotated toward the side member 30 until the opposite edge of the part is engaged in the corresponding slot 38. Typically each structure 20 will be designed to hold at least 20 individual parts.

Assume, for example, that the device 10 is to be used for handling thin ceramic planar rectangular substrates. The slots may have a typical width dimension of 0.12 inches on 0.16 inch centers, with the thickness of material defining the slots being 0.04 inches. The relative dimensions of the diameter of the adjustment member 36 and the spacing of the pivot openings 42 from the side plate member 30 may be selected so that the dimension X (FIG. 2) is continuously variable by rotating the adjustment member 36 from about 0.75 to 1.5 inches. Thus, for this example, the structure 10 could accommodate substrates whose X dimension varies from 0.75 to 1.5 inches without requiring tools or disassembly of the structure 10. Members 30 and 36 in this example have V-shaped slots. These V-shaped slots can accept material thickness above and below the nominal thickness dimension of the substrates or other parts.

Figure 3:
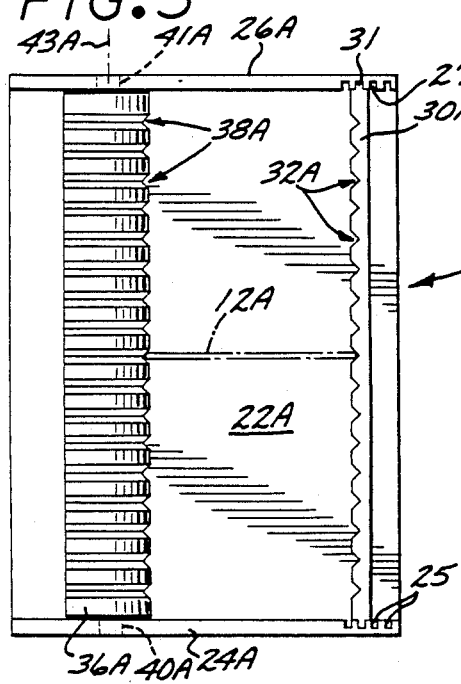
FIG. 3 is a top view of a second embodiment of an adjustable carrier device embodying the invention.
Figure 4:
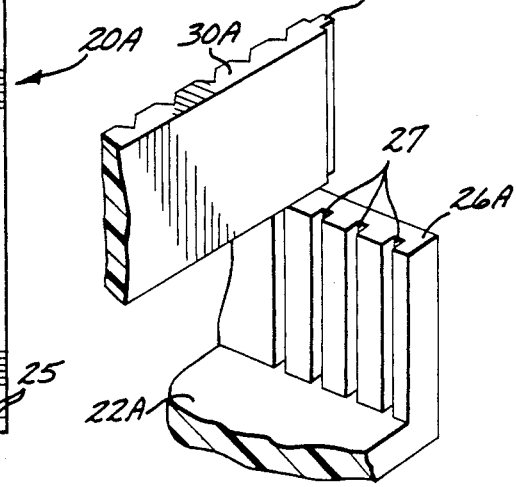
FIG. 4 is a partially broken-away view of the embodiment of FIG. 3 showing the adjustability of the side wall positioning.

In a second embodiment shown in FIGS. 3 and 4, the structure 20A is identical to the structure 20 of FIGS. 1 and 2 except that a means is provided for adjusting the position of side plate member 30A relative to the pivot axis 43A of semicylindrical adjustment member 36A. This means comprises a plurality of vertical aligned slots 27 formed in end plate members 24A and 26A, respectively, and matching tongue elements 31 defined at the ends of removable side member 30A. Thus, the position of the side plate member 30A can be adjusted relative to the pivot axis 43A of the member 36A by inserting the tongues 31 in a desired set of slots 27. This provides a further range of adjustment to accommodate an even larger size range of parts than the embodiment of FIGS. 1 and 2.

Preferably the carrier device elements are fabricated from a plastic material, such as polypropylene, which is suitable for injection molding fabrication. For applications in which the device will be subjected to higher temperatures or to solvents, the device can be fabricated from polytetrafluoroethylene. One possible application for the device is to carry parts while they are being cleaned in a solvent bath, and the material must be capable of withstanding the higher temperature and be impervious to the solvent solutions for such applications.

Figure 5:
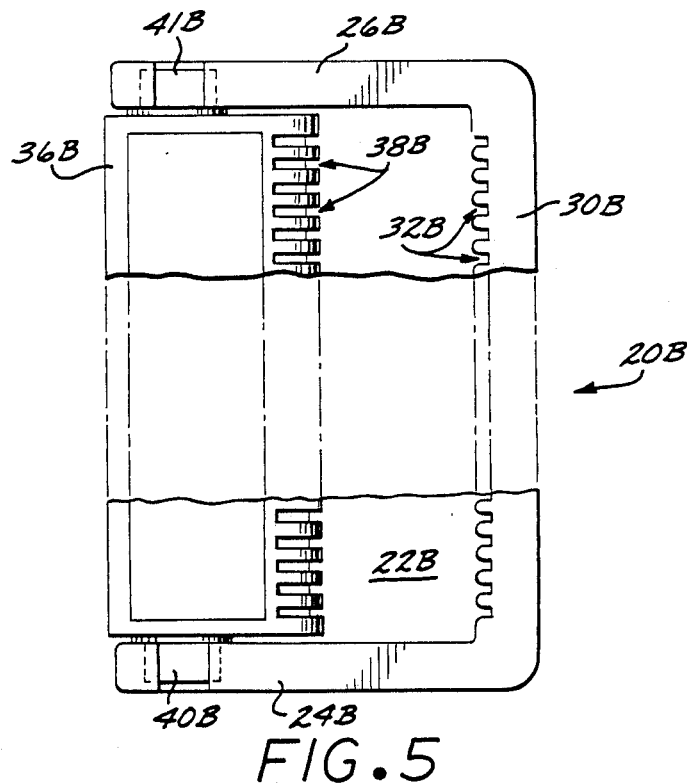
FIGS. 5 and 6 are top and end views of a third embodiment of an adjustable carrier device embodying the invention.
Figure 6:
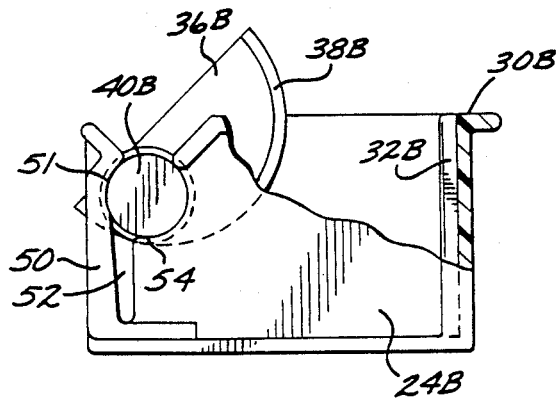

Referring now to FIGS. 5 and 6, a third embodiment of the invention is disclosed. This embodiment is similar to the embodiment of FIGS. 1 and 2, but with a somewhat different yoke arrangement. Here, an adjustment member 36B is secured to end plates 24B and 26B by pins 40B which are received in self-tightening yoke openings 52 formed in each of the end plates 24B and 26B by tabs 50. End members 24B and 26B are fashioned to form semicircular regions 54 which define the pivot openings for the pins in combination with curved regions 51 formed by the tabs 50. With the end members 24B and 26B formed of a resilient plastic material, the surfaces 51 of the tabs 50 resiliently engage the pins 40B and 41B to secure the pins in the pivot openings in a snap fit. This type of pivot engagement ensures smooth operation of the adjustment member as the pivot members wear from use.

The carrier devices described above provide good protection for fragile panel-like structures such as ceramic substrates, semiconductor wafers, LCD panel displays and the like. Because the devices are adjustable to fit many sizes and shapes of parts, fewer types are required, reducing or virtually eliminating the need to have various sizes of carriers on hand or in inventory. Through better protection of the parts, losses due to breakage, chipping, scratching or other damage during handling is substantially reduced.

It is understood that the above-described embodiments are merely illustrative of some of the many possible specific embodiments which may represent applications of the principles of the present invention. Other arrangements may readily be revised in accordance with these principles by those skilled in the art without departing from the scope of the invention. For example, the slots 38 in the adjustment member 36 may be unnecessary for some applications, or may be replaced by slots formed in the bottom plate 22 or by deepening the slots 32. Further, the shape of the adjustment member 36 is not limited to a semicylindrical shape, and other cross-sectional shapes other than a semicircle may be employed semi-oval or semi-teardrop shapes. The same effect may be achieved by rotating members of other cross-sectional shapes which are mounted on-axis but which have asymmetrical cross-sectional configurations.

What is claimed is:

1. A carrier device for handling panel-like parts in predetermined part locations, which is adjustable over a continuous size range to accommodate parts of various sizes, said device comprising:
    an elongated side member having a plurality of aligned slots formed therein, the width of each slot being sufficient to receive an edge of a part within the slot;
    an elongated adjustment member having a curved outer peripheral surface and first and second pivot pin members extending from each end thereof;
    a bottom member and first and second end members which are joined with said elongated side members to comprise a box like structure, said end members having a pivot opening defined therein for receiving a corresponding one of said pivot pins for mounting said adjustment member for rotation about a pivot axis;
    said curved outer peripheral surface of said elongated adjustment member being adapted so that as said member is rotated about said axis, said surface is disposed progressively nearer to or further from said side member so as to adjust the spacing between said adjustment member and said side member.

2. The carrier device of claim 1 further comprising means for securing said side member in a selected one of a plurality of positions in relation to said adjustment member, said securing means further increasing the adjustment range of the carrier device.

3. The carrier device of claim 2 wherein said adjustable securing means comprises a plurality of spaced aligned slots formed in each of said end members, first and second tongue members extending from opposing ends of said side member for engaging in selected ones of the slots formed in said end members, wherein said tongue members are selectively and removably inserted in a corresponding set of said end member slots which are spaced equidistant from the pivot axis of said adjustment member to secure the side member at a desired location relative to the pivot axis.

4. The carrier device of claim 1 wherein said adjustment member and said side member are comprised of polypropylene or polytetrafluoroethylene.

5. The carrier device of claim 1 further comprising a removable protective cover for fitting over parts disposed therein.

6. A carrier device for carrying parts in predetermined part locations, which is adjustable over a continuous size range to parts of different sizes, said device comprising:
    an elongated side plate member having a plurality of aligned slots formed therein, the width of each slot being sufficient to receive an edge of a part within the slot;
    a semi-cylindrical adjustment member having a plurality of aligned circumferential slots defined therein, and further comprising first and second aligned pivot-pin members extending from the ends of the adjustment member and which are offset from the center axis of said adjustment member; and
    means for mounting said adjustment member for rotation about said pivot-pin members so as to provide an eccentric pivot of said adjustment member, and wherein each circumferential slot in said adjustment member is aligned with a respective one of said slots in said side plate member to form one of said part locations, and wherein as said adjustment member is pivoted on said eccentric pivot, the distance between said respective circumferential slot and said side plate slot is varied to adjust for parts of different sizes.

7. The carrier device of claim 6 further comprising a box-like structure comprising said side plate member, a bottom plate member and first and second end plate members, and wherein said end plate members cooperate to provide a yoke comprising said mounting means.

8. The carrier device of claim 7 wherein each of said end plate members further comprises a pivot opening defined therein for receiving a corresponding one of said pivot pins.

9. The carrier device of claim 7 further comprising means for securing said side plate member in a selected one of a plurality of positions in relation to said adjustment member, said securing means further increasing the adjustment range of the carrier device.

10. The carrier device of claim 9 wherein said adjustable securing means comprises a plurality of spaced aligned slots formed in each of said end plate members, first and second tongue members extending from opposing ends of said side plate member for engaging in selected ones of the slots formed in said end plate members, wherein said tongue members are selectively and removably inserted in a corresponding set of said end plate slots which are spaced equidistant from the pivot axis of said adjustment member to secure the side plate at a desired location relative to the pivot axis.

11. The carrier device of claim 6 wherein said adjustment member and said side plate member are comprised of polypropylene or polytetrafluoroethylene.

12. The carrier device of claim 6 further comprising a removable protective cover for fitting over parts disposed therein.

13. The carrier device of claim 6 wherein said means for mounting said adjustment member further comprises means for applying a tensioning force against said pivot pins to hold the adjustment member at rotational positions against the force of gravity.

14. A carrier device for carrying thin panel-shaped parts in predetermined rack locations, the size of the rack locations being adjustable over a continuous size range to adjust to parts of different sizes, said device comprising:
    an elongated side plate member having a plurality of aligned slots formed therein, the width of each slot being sufficient to receive an edge of a part;
    a bottom plate member and first and second end structural members which are joined with said side member to comprise a boxlike structure;
    a semi-cylindrical adjustment member having a plurality of aligned circumferential slots formed in the curved external peripheral surface thereof, and further comprising first and second pivot pins extending from respective ends of said elongated members and which are offset from the center axis of said adjustment member; and means for mounting said adjustment member for rotation about said pivot pin members so as to provide an eccentric pivot of said adjustment member, and wherein each circumferential slot in said adjustment member is aligned with a respective one of said rack locations, and wherein as said adjustment member is pivoted on said eccentric pivot, the distance between said respective circumferential slot and said side member slot is varied to adjust the width therebetween.

15. The carrier device of claim 14 wherein said first and second end structural members each have pivot openings formed therein for receiving respective ones of said pivot pins therein, wherein said mounting means comprises said first and second end structural members and said openings.

16. The carrier device of claim 14 wherein said pins fit relatively tightly within said openings so as to frictionally engage the same and maintain the rotational position of said adjustment member at a desired position.

17. The carrier device of claim 14 further comprising a removable cover for fitting over parts disposed in said rack locations.

* * * * *